United States Patent
Abdo

(10) Patent No.: US 9,806,711 B1
(45) Date of Patent: Oct. 31, 2017

(54) QUANTUM LIMITED JOSEPHSON AMPLIFIER WITH SPATIAL SEPARATION BETWEEN SPECTRALLY DEGENERATE SIGNAL AND IDLER MODES

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/278,918

(22) Filed: Sep. 28, 2016

(51) Int. Cl.
| | | |
|---|---|---|
| *H03K 17/92* | (2006.01) | |
| *H03F 7/04* | (2006.01) | |
| *G06N 99/00* | (2010.01) | |

(52) U.S. Cl.
CPC .......... *H03K 17/92* (2013.01); *G06N 99/002* (2013.01); *H03F 7/04* (2013.01)

(58) Field of Classification Search
CPC .................................. H03K 17/92; H03F 3/04
See application file for complete search history.

(56) References Cited

U.S. PATENT DOCUMENTS

| | | | |
|---|---|---|---|
| 2016/0233860 A1* | 8/2016 | Naaman | H03K 17/92 |
| 2017/0039481 A1* | 2/2017 | Abdo | G06N 99/002 |
| 2017/0062107 A1* | 3/2017 | Naaman | H03K 17/92 |
| 2017/0085231 A1* | 3/2017 | Abdo | H03F 1/42 |
| 2017/0091648 A1* | 3/2017 | Abdo | G06N 99/002 |
| 2017/0093381 A1* | 3/2017 | Abdo | H01L 39/025 |
| 2017/0104695 A1* | 4/2017 | Naaman | H04L 49/40 |

OTHER PUBLICATIONS

Abdo et al., "Nondegenerate three-wave mixing with the Josephson ring modulator", 2013, Physical Review B 87, 014508, American Physical Society.*

* cited by examiner

*Primary Examiner* — Dean Takaoka
*Assistant Examiner* — Alan Wong
(74) *Attorney, Agent, or Firm* — Cantor Colburn LLP; Vazken Alexanian

(57) ABSTRACT

A technique relates to a quantum-limited microwave amplifier. A Josephson ring modulator (JRM) is connected to a first lumped-element resonator. The first lumped-element resonator includes one or more first lumped elements. A second lumped-element resonator is connected to the JRM, and the second lumped-element resonator includes one or more second lumped elements. The JRM, the first lumped-element resonator, and the second-lumped element resonator form a Josephson parametric converter (JPC). The one or more first lumped elements and the one or more second lumped elements have a value that is the same, thereby configuring the JPC to be spectrally degenerate.

20 Claims, 4 Drawing Sheets

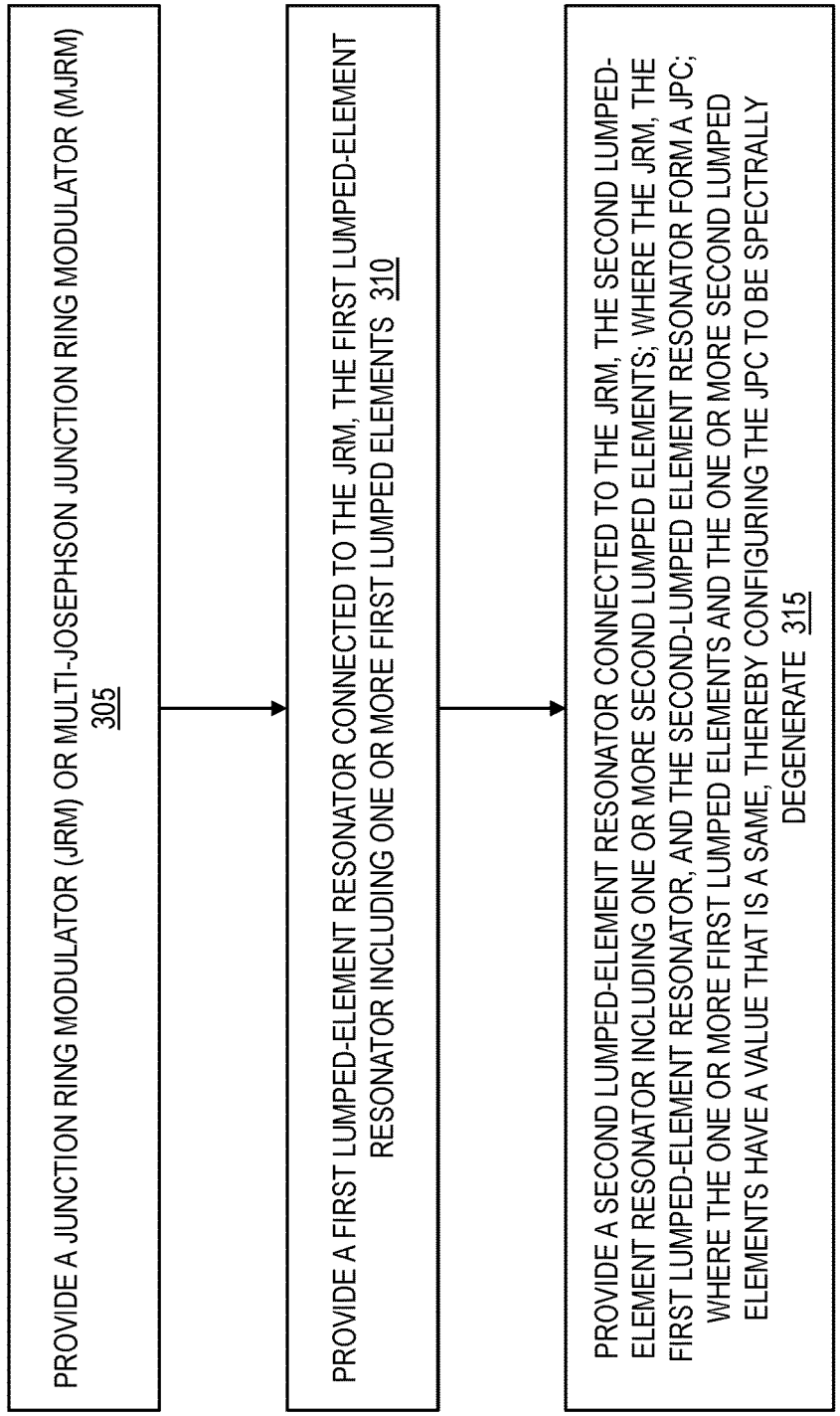

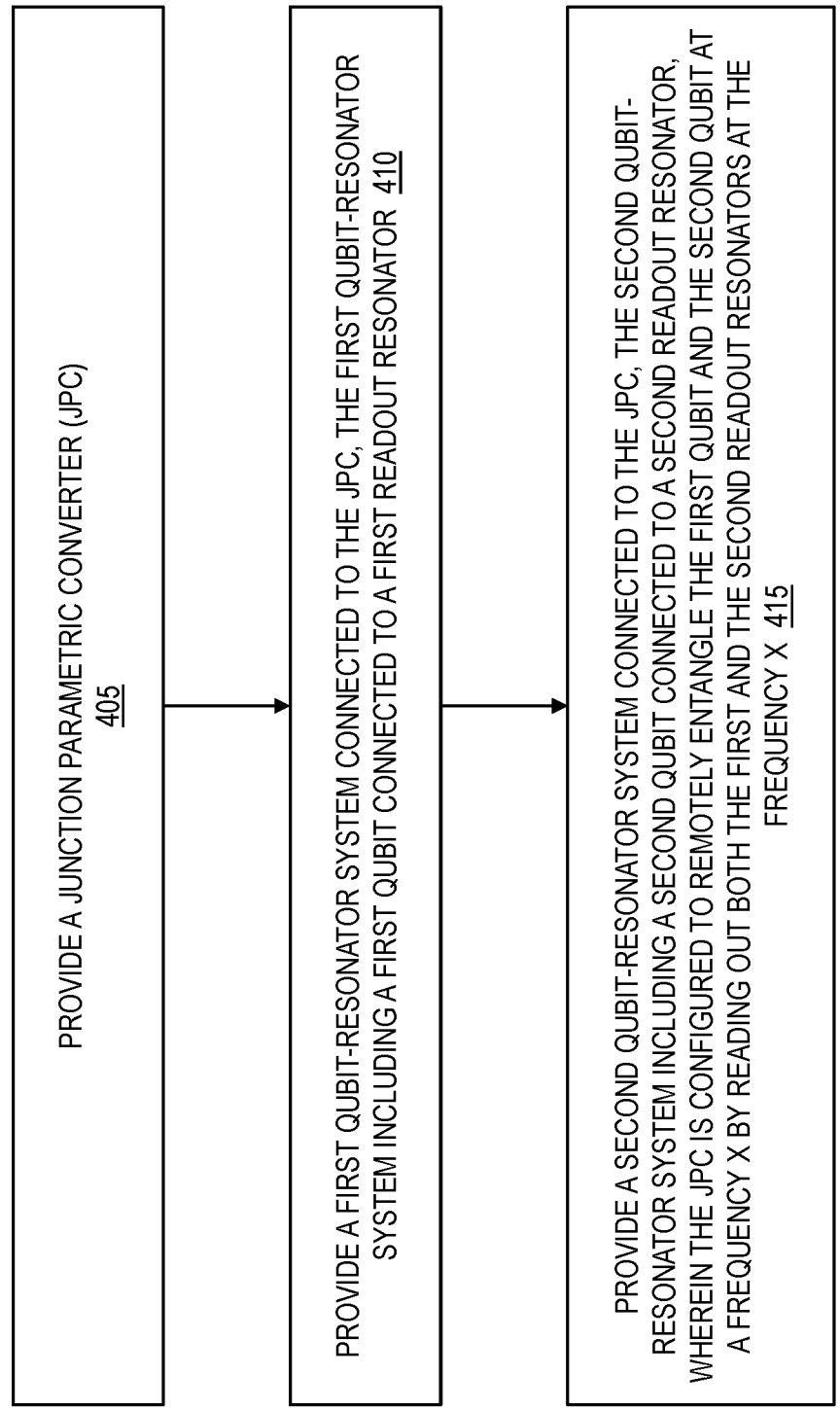

QUANTUM LIMITED JOSEPHSON AMPLIFIER WITH SPATIAL SEPARATION BETWEEN SPECTRALLY DEGENERATE SIGNAL AND IDLER MODES

BACKGROUND

The present invention relates to superconducting electronic devices, and more specifically, a quantum-limited Josephson amplifier with spatial separation between spectrally degenerate signal and idler modes.

In circuit quantum electrodynamics, quantum computing employs nonlinear superconducting devices called qubits to manipulate and store quantum information at microwave frequencies, and resonators (e.g., as a two-dimensional (2D) planar waveguide or as a three-dimensional (3D) microwave cavity) to read out and facilitate interaction among qubits. As one example, each superconducting qubit can include one or more Josephson junctions shunted by capacitors in parallel with the junctions. The qubits are capacitively coupled to resonators (e.g., 2D or 3D microwave cavities).

SUMMARY

According to one or more embodiments, a quantum-limited microwave amplifier is provided. The amplifier includes a Josephson ring modulator (JRM), and a first lumped-element resonator connected to the JRM. The first lumped-element resonator includes one or more first lumped elements. Also, the amplifier includes a second lumped-element resonator connected to the JRM. The second lumped-element resonator includes one or more second lumped elements. The JRM, the first lumped-element resonator, and the second-lumped element resonator form a Josephson parametric converter (JPC). The one or more first lumped elements and the one or more second lumped elements have a value that is the same, thereby configuring the JPC to be spectrally degenerate.

According to one or more embodiments, a method of configuring a quantum-limited microwave amplifier is provided. The method includes providing a JRM, and providing a first lumped-element resonator connected to the JRM, where the first lumped-element resonator includes one or more first lumped elements. Also, the method includes providing a second lumped-element resonator connected to the JRM, where the second lumped-element resonator includes one or more second lumped elements. The JRM, the first lumped-element resonator, and the second-lumped element resonator form a JPC. The one or more first lumped elements and the one or more second lumped elements have a value that is the same, thereby configuring the JPC to be spectrally degenerate.

According to one or more embodiments, a system for remotely entangling qubits via measurement is provided. The system includes a JPC and a first qubit-resonator system connected to the JPC. The first qubit-resonator system includes a first qubit coupled to a first readout resonator. Also, the system includes a second qubit-resonator system connected to the JPC. The second qubit-resonator system includes a second qubit coupled to a second readout resonator, and the JPC is configured to remotely entangle the first qubit and the second qubit by reading out both the first and the second readout resonators at the frequency X.

According to one or more embodiments, a method of configuring a system for remotely entangling qubits via measurement is provided. The method includes providing a JPC, and providing a first qubit-resonator system connected to the JPC. The first qubit-resonator system includes a first qubit connected to a first readout resonator. Also, the method includes providing a second qubit-resonator system connected to the JPC, where the second qubit-resonator system includes a second qubit connected to a second readout resonator. The JPC is configured to remotely entangle the first qubit and the second qubit by reading out both the first and the second readout resonators at the frequency X.

BRIEF DESCRIPTION OF THE DRAWINGS

FIG. 3 is a flowchart of a method of configuring a quantum-limited microwave amplifier according to one or more embodiments.

FIG. 4 is a flowchart of a method for configuring a system for remotely entangling qubits via measurement according to one or more embodiments.

DETAILED DESCRIPTION

Figure 1:
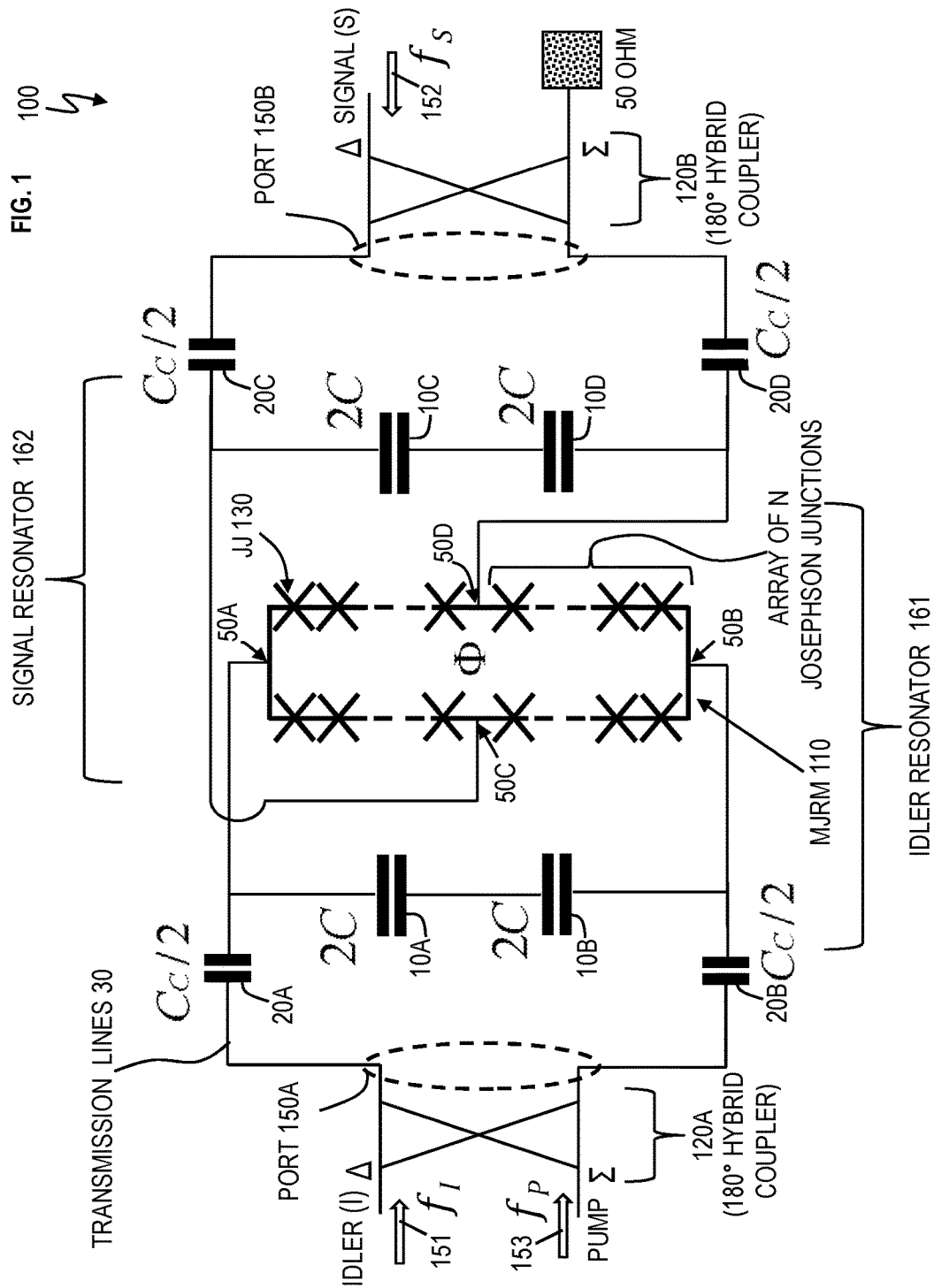
FIG. 1 is a schematic of a circuit for a superconducting Josephson parametric converter according to one or more embodiments

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The electromagnetic energy associated with the qubit is stored in the Josephson junctions and in the capacitive and inductive elements forming the qubit. In one example, to read out the qubit state, a microwave signal is applied to the microwave readout cavity that couples to the qubit at the cavity frequency corresponding to the qubit state. The transmitted (or reflected) microwave signal goes through multiple thermal isolation stages and low-noise amplifiers that are required to block or reduce the noise and improve the signal-to-noise ratio. The microwave signal is measured at room temperature. The amplitude and/or phase of the returned/output microwave signal carry information about the qubit state, such as being at the ground or excited states or at a superposition of the two states. A microwave readout provides a stable signal amplitude for control, and commercial off-the-shelf (COTS) hardware is available to use that covers most of microwave frequency ranges.

A Josephson ring modulator (JRM) is a nonlinear dispersive element based on Josephson tunnel junctions that can perform three-wave mixing of microwave signals at the quantum limit. The JRM consists of four nominally identical Josephson junctions (JJ) arranged in a Wheatstone bridge configuration. In order to construct a nondegenerate parametric device such as a Josephson parametric converter (JPC), which is capable of amplifying and/or mixing microwave signals at the quantum limit, the JRM is incorporated into two microwave resonators at an RF-current anti-node of their fundamental eigenmodes. As has been demonstrated in several experimental and theoretical works, the performances of these JPCs, namely power gain, dynamical bandwidth, and dynamic range, are strongly dependent on the critical current of the JJs of the JRM, the specific realization of the electromagnetic environment (i.e., the microwave resonators), and the coupling between the JRM and the resonators.

In order to enhance certain performances of JPCs, various microwave resonators have been realized and proposed, such as, coplanar stripline resonators, microstrip resonators, compact/lumped-element resonators, and three-dimensional cavities. In the state-of-the-art, it has also been suggested to enhance the dynamic range of JPCs by enhancing the critical current of JJs that form the JRM by, for example, using niobium junctions and nanobridges. Moreover, it has been shown that the tunable bandwidth of JPCs can be increased by shunting the JJs of the JRM with linear inductance.

Josephson parametric converters are quantum-limited microwave amplifiers that can be used to readout the quantum state of superconducting qubits, quantum dots, etc. The JPC is a nondegenerate amplifier in which the signal and idler modes are both spatially and spectrally separate. The signal and idler have different physical ports and resonators (i.e., spatial separation), and the signal and idler also have different frequencies (i.e., spectral separation).

The Josephson parametric amplifier (JPA) is a degenerate amplifier in which the signal and idler modes share the same physical port and resonator, but can have either slightly different frequencies within the bandwidth of the amplifier (i.e., phase preserving mode) or have the same frequency (i.e., phase sensitive mode).

The same applies for Josephson Traveling Wave Parametric Amplifiers (JTWPAs) and Kinetic Inductance Traveling Wave Amplifiers (KITWA) which are formed using nonlinear transmission lines that lack resonators (except those used within the transmission lines for phase matching purposes).

However, in the-state-of-the-art, there is no quantum-limited parametric amplifier available that has different physical ports for the signal and idler modes while allowing their frequencies to match, i.e., allowing the signal and idler frequencies to match. One main reason is that by making the JPC microstrip resonators (transmission-line based) identical, the pump frequency required for amplification which corresponds to the sum of the signal and idler resonance frequencies would coincide with the frequency of the second harmonic of the signal and idler resonators, thus making the "pump drive soft" which negatively affects the amplifier performance. Furthermore, by making the two transmission-line resonators identical (i.e., making the signal and idler resonators identical) for the signal and idler modes, the frequency of the "parasitic" common mode of the device (which corresponds to direct transmission between the signal and idler ports) would coincide with the signal and idler frequencies as well leading to direct leakage between the ports (i.e., between the signal and idler ports).

Turning now to an overview of aspects of the present invention, one or more embodiments discuss how to build or configure a quantum limited microwave amplifier that is spatially nondegenerate (i.e., has different ports for the signal and idler modes), is spectrally degenerate (i.e., has the same frequency for signal and idler resonators), and is able perform three-wave mixing. In order to achieve this, one or more embodiments utilize lumped-element JPCs whose the signal and idler resonators are made of lumped-element inductors and capacitors, and these lumped-elements for the signal and idler resonators are nominally identical. The combination of the two requirements constitutes a benefit in the JPC. One or more embodiments illustrate that such a structure or device configuration would addresses the problems outlined previously with regard to JPCs that are based on transmission-line resonators. The fact that the lumped-element resonators lack a second harmonic resonance mode (i.e., at twice the fundamental resonance frequency) ensures that the pump drive remains "stiff" in embodiments, thus maintaining the device performance compared to the nondegenerate case. Furthermore, in one or more embodiments, the frequency of the common mode of the lumped-element JPC does not coincide with the frequency of signal and idler modes (e.g., the frequency of the common mode is either higher or lower than the frequency of the signal or the idler, depending on the exact circuit), thus ensuring the two modes (signal and idler) are isolated against direct transmission across the signal and idler ports. This means that the common mode is not equal to the resonance frequency of the signal or the idler resonator.

Turning now to a more detailed description of aspects of the present invention, FIG. 1 is a schematic of a circuit for a JPC 100 according to one or more embodiments. The JPC 100 includes port 150A and port 150B. The port 150A can be connected to a broadband 180 degree hybrid coupler 120A and the port 150B can be connected to a broadband 180 degree hybrid coupler 120B. The 180 degree hybrid couplers 120A and 120B each have a difference ($\Delta$) port and a sum ($\Sigma$) port. For 180 degree hybrid coupler 120A, the idler (I) is connected to the $\Delta$ port and the pump (P) is connected to the $\Sigma$ port. For 180 degree hybrid coupler 120B, the signal (S) is connected to the $\Delta$ port and a termination impendence point (e.g., 50 ohm ($\Omega$) termination environment) is connected to the $\Sigma$ port.

A 180° hybrid coupler is a 4-port microwave device that is reciprocal, matched, and ideally lossless. The 180° hybrid splits an input signal into two equal amplitude outputs. When fed from its sum port ($\Sigma$) the 180° hybrid provides two equal-amplitude in-phase output signals. Whereas when fed from its difference port ($\Delta$), it provides two equal amplitude 180° out-of-phase output signals.

The JPC 100 includes a multi-Josephson junction ring modulator (MJRM) 110. The MJRM 110 includes multiple Josephson junctions 130 connected together (in series) to form the loop/ring in the MJRM 110. The MJRM 110 includes an array of N Josephson junctions 130. In one implementation, N=1-15 in the array of N JJs. In one implementation, N=6 JJs in the MRJM 110. As understood by one skilled in the art, a magnetic flux $\Phi$ threads the loop of the MJRM 110. The choice of the number of Josephson junctions N in each arm of the JRM can be influenced by two conflicting considerations and the balance between them. The first consideration is to enhance the dynamic range of the device by adding more Josephson junctions in series, while the second is not to dilute the nonlinearity of the JRM considerably (since the nonlinearity of the JRM decreases with increasing N).

An idler resonator 161 includes lumped-element capacitors 10A and 10B in parallel with the MJRM 110. A signal resonator 162 includes lumped-elements capacitors 10C and 10D in parallel with the MJRM 110. The idler resonator 161 and the signal resonator 162 both share or utilize the MJRM 110. In both the idler resonator 161 and the signal resonator 162, the value is the same for each of the lumped-element capacitors 10A, 10B, 10C, and 10D and this value is designated as 2C, where C represents capacitance. Although lumped-element capacitors 10A-D are illustrated, one implementation can have in addition lumped-element inductors in parallel or series with the MJRM 110. A microwave component/element is described as lumped (versus distributed) if its dimensions are very small compared to the wavelength of the minimum working frequency (e.g., smaller than 1/10 of the wavelength corresponding to the minimum operational frequency of the device). For example, Josephson junctions are considered to a very good approximation, as lumped nonlinear inductors for microwave signals in the range 1-20 GHz.

The lumped-element capacitors 10A and 10B of the idler resonator 161 connect to opposite ends of the MJRM 110, for example, at nodes 50A and 50B of the MJRM 110. The lumped-element capacitors 10C and 10D of the signal resonator 162 connect to opposite ends of the MJRM 110, for example, at nodes 50C and 50D of the MJRM 110.

The JPC 100 includes coupling capacitors 20A and 20B which connect the port 150A to the idler resonator 161. Also, the JPC includes coupling capacitors 20C and 20D which connect the port 150B to the signal resonator 162. The coupling capacitors 20A, 20B, 20C, and 20D each have the same value, and this value is designated $C_c/2$. The value of coupling capacitors 20A, 20B, 20C, and 20D is mainly determined such that it sets a desirable bandwidth for the idler resonator 161 and the signal resonator 162 (without sacrificing the device stability as would be understood by one skilled in the art).

The idler microwave signal/tone 151 is at the frequency $f_I$ and the signal microwave signal/tone 152 is at the frequency $f_S$. The pump microwave signal/tone 153 is at the frequency $f_P$. For the JPC device 100 to be in amplification mode (with photon gain), the applied pump frequency $f_P$ satisfies the relation $$f_P = f_I + f_S,$$

where $f_S$ and $f_I$ are the frequency of the Signal (S) and the Idler (I) tones respectively.

In a state-of-the-art JPC, the idler microwave signal and the signal microwave signal are required to satisfy the requirement of $f_S < f_I$. For example, the idler frequency $f_I$ can be 10 gigahertz (GHz) and the signal frequency $f_S$ can be 7 GHz, resulting in the pump frequency $f_P$ being 17 GHz. In the state-of-the-art JPC, the idler frequency $f_I$ cannot be equal (or nearly equal) to the signal frequency $f_S$ because the pump frequency $f_P$ (where $f_P = f_I + f_S$) would coincide with the second harmonic of the idler resonator and the signal resonator, thus making the pump drive soft and negatively affecting the amplifier performance, such as significantly decreasing its dynamic range (where the dynamic range is the maximum input power that the device can handle at a certain working point).

In contrast to the state-of-the-art, the JPC 100 in embodiments has the lumped-element idler resonator 161 and lumped-element signal resonator 162, and the idler and signal resonators 161 and 162 do not have a second harmonic which ensures that the pump drive remains stiff, thus maintaining the JPC performance compared to the nondegenerate case (in the state-of-the-art). Therefore, in the JPC 100, the idler microwave signal 151 at frequency $f_I$ and the signal microwave signal 152 at frequency $f_S$ are configured to satisfy the relation $$f_I = f_S.$$

Therefore, the idler frequency $f_I$ is to be equal (or about equal) to the signal frequency $f_S$. For example, the idler frequency $f_I$ can be 10 gigahertz (GHz) and the signal frequency $f_S$ can be 10 GHz, resulting in the pump frequency $f_P$ being 20 GHz. The frequency of the pump drive $f_P$ (in amplification) of the lumped-element JPC 100 does not coincide with the frequency (which is the same) of signal and idler modes (resonators 162 and 161) and/or does not coincide with the second resonance frequency of the lumped-element resonators which are the idler resonator 161 and the signal resonator 162. Also, the frequency of the common mode of the JPC device 100 does not coincide with $f_I$ and $f_S$. It is either higher or lower than the $f_I$ and $f_S$, thereby ensuring that the idler mode (idler resonator 161) and signal mode (signal resonator 162) are isolated against direct transmission across the signal port (i.e., Δ port of the hybrid coupler 120B) and idler port (i.e., Δ port of the hybrid coupler 120A). That is, the idler microwave signal 151 (input at the Δ (idler) port of the hybrid coupler 120A) is not output at the Δ (signal) port of the hybrid coupler 120B, and the signal microwave signal 152 (input at the Δ (signal) port the hybrid coupler 120B) is not output at the Δ (idler) port of the hybrid coupler 120A, even while satisfying the condition $f_I = f_S$.

The JPC 100 including the capacitors 10A-D and 20A-D (with the exception of the dielectric material in the capacitors), transmission lines 30, Josephson junctions 130 (with the exception of the thin insulating material), and ports 150A and 150B are made of superconducting material. Additionally, the hybrid couplers 120A and 120B are made of low loss normal metals or can be made of superconducting material. Also, the qubit-resonator systems discussed below are made of superconducting material. Examples of superconducting materials (at low temperatures, such as about 10-100 millikelvin (mK), or about 4 K) include niobium, aluminum, tantalum, etc.

Figure 2:
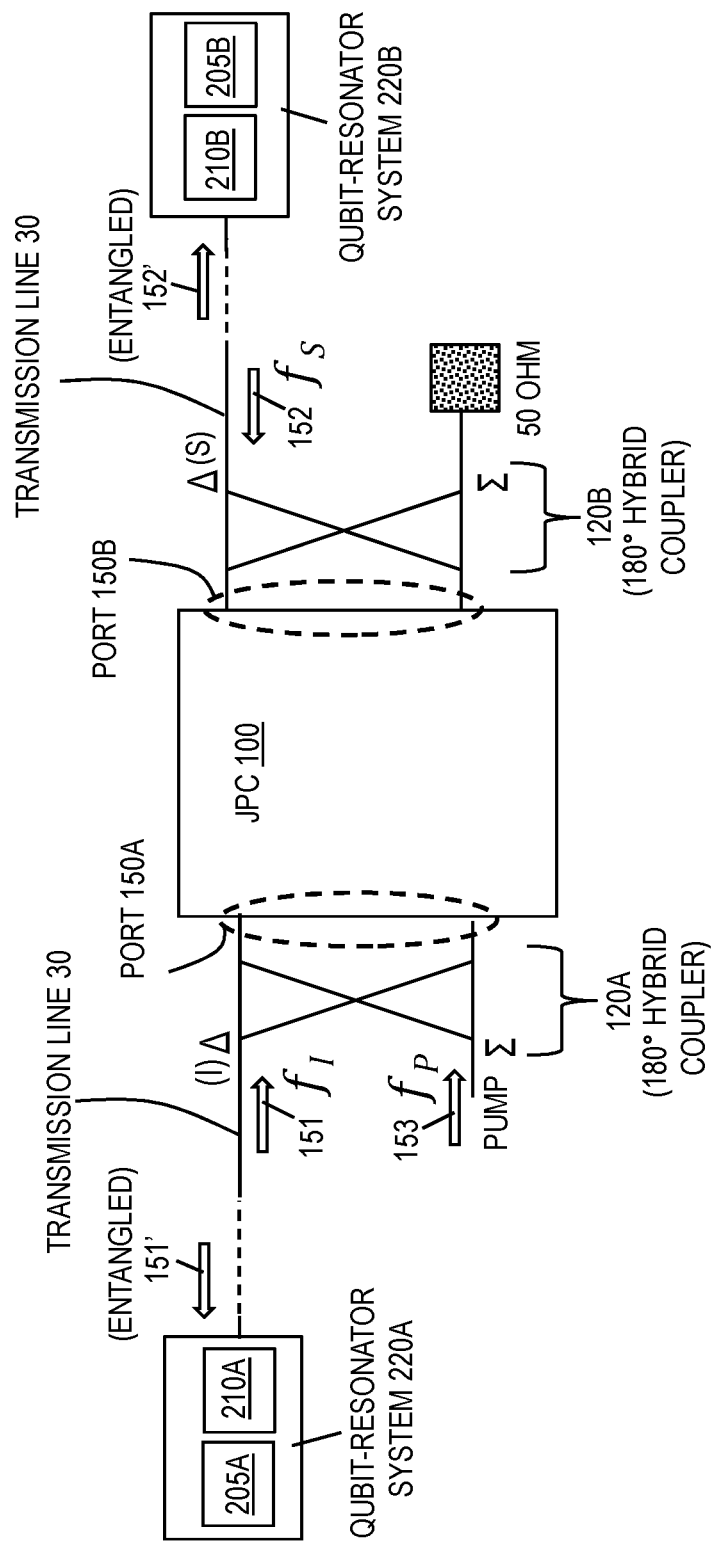
FIG. 2 is a schematic of a system for remotely entangling qubits using the Josephson parametric converter according to one or more embodiments.

FIG. 2 is a schematic of a system 200 for remotely entangling qubits using the JPC 100 according to one or more embodiments. In FIG. 2, the details of the JPC 100 are omitted for the sake of clarity, and it is understood that the JPC 100 includes the features discussed in FIG. 1. The system 200 illustrates the JPC 100 connected to qubit-resonator system 220A via the idler port 150A through hybrid coupler 120A and the JPC 100 connected to qubit-resonator system 220B via the signal port 150B through hybrid coupler 120B.

The qubit-resonator system 220A includes qubit 205A connected to its readout resonator 210A. The qubit-resonator system 220B includes qubit 205B connected to its readout resonator 210B.

In one implementation, the qubit-resonator systems 220A and 220B can be coupled to each other locally on the same chip. In another implementation, qubit-resonator systems 220A and 220B can be remote from each other on the same chip or on two different chips. The readout resonators 210A and 210B are configured to have the same resonance frequency X which coincides with the two resonance frequencies of the JPC (i.e., the signal resonator 162 and the idler resonator 161). In other words, the readout resonators 210A and 210B, the idler resonator 161, and the signal resonator 162 each have the same resonance frequency X. It is noted that the frequency X represents a microwave frequency such, for example, 10 GHz. It is appreciated that the frequency X can be other microwave frequencies. As noted above, since the idler resonator 161 and the signal resonator 162 are lumped-element resonators, the idler resonator 161 and signal resonator 162 only have a fundamental resonance frequency which is a first resonance frequency and do not have a second resonance frequency at twice the fundamental resonance frequency, thereby allowing the idler resonator 161 and signal resonator 162 to have the same resonance frequency and allowing the JPC 100 to operate as an amplifier $f_P=f_I+f_S$ without negative effects, such as a reduction in the dynamic range of the devices and direct power leakage between the signal and idler resonators and ports.

In qubit-resonator systems 220A and 220B, the respective qubits 205A and 205B can have two different qubit frequencies in one implementation. In another implementation, the qubits 205A and 205B can have the same qubit frequency.

In qubit-resonator system 220A, the qubit 205A can be driven separately through a separate port not necessarily through its corresponding readout resonator 210A. In qubit-resonator systems 220B, the qubit 205B can be driven separately through a separate port not necessarily through its corresponding readout resonator 210B.

The JPC 100 when operated in amplification (meaning $f_P=f_I+f_S$) can remotely entangle (at the same frequency X) these two qubits 205A and 205B by generating and sending to the readout resonators 210A and 210B two readout tones/signals (i.e., microwave signals 151' and 152', respectively). The microwave signal 151' at frequency $f_I$ and microwave signal 152' at frequency $f_S$ each include entangled photons (signal and idler), and both microwave signals 151' and 152' are at frequency X, which means $f_I=f_S=$frequency X. The microwave signals 151' and 152' are readout signals that respectively measure the qubits 205A and 205B by individually probing (i.e., reading out) their readout resonators 210A and 210B.

The qubits 205A and 205B are initialized to a certain state or driven to a certain state as a result of a calculation. The entanglement happens as a result of joint measurement of the two qubit states of qubits 205A and 205B using the two entangled microwave signals 151' and 152' (readout tones) which include entangled photons. In other words, probing the state of the two qubits 205A and 205B with two entangled readout beams (microwave signals 151' and 152') results in entanglement of the two qubits 205A and 205B.

An example scenario is provided for illustration and not limitation. The microwave signal 151 at frequency $f_I$ (equal to frequency X) is transmitted to the JPC 100 via the difference port of hybrid coupler 120A through port 150A of the JPC 100. The microwave signal 152 at frequency $f_S$ (also equal to frequency X) is transmitted to the JPC 100 via the difference port of hybrid coupler 120B through port 150B of the JPC 100. Additionally, the pump microwave signal 153 is applied via the sum port of the hybrid coupler 120A through the port 150A, and the pump microwave signal 153 is at the pump frequency $f_P=f_I+f_S$.

The microwave signal 151 interacts with the idler resonator 161 which includes interacting with the MJRM 110, while the microwave signal 152 interacts with the signal resonator 162 which also includes interacting with the MJRM 110. By both microwave signals 151 and 152 together interacting with the MJRM 110, the photons of microwave signal 151 become entangled with the photons of microwave signal 152 (and vice versa) via a three-wave mixing process taking place in the JPC device 100 (or in other words, through a down-conversion of pump photons into entangled pairs of signal and idler photons). After interacting with the idler resonator 161 (including MJRM 110), the reflected/generated microwave signal 151 is designated as microwave signal 151'. Likewise, after interacting with the signal resonator 162 (including MJRM 110), the reflected/generated microwave signal 152 is designated as microwave signal 152'. The reflected microwave signal 151' and 152' have entangled photons at the frequency $f_I=f_S=$frequency X (e.g., 10 GHz). For example, there can be a first pair of entangled photons, e.g., one photon in the microwave signal 151' is entangled with one photon in the microwave signal 152', a second pair of entangled photons, e.g., another photon in the microwave signal 151' is entangled with another photon in the microwave signal 152', through a last pair of entangled photons, e.g., yet another photon in the microwave signal 151' is entangled with yet another photon in the microwave signal 152'. Accordingly, there can be multiple pairs of entangled photons between the microwave signal 151' and 152'.

The reflected microwave signal 151' is transmitted to the qubit-resonator system 220A as the readout signal for readout resonator 210A while the reflected microwave signal 152' is transmitted to the qubit-resonator system 220B as the readout signal for readout resonator 210B, thereby entangling the qubits 205A and 205B. To measure qubit 205A, the microwave signal 151' at frequency X causes the readout resonator 210A to read out the state information of qubit 205A, and this microwave signal 151' (at frequency X) containing qubit state information can be sent to a photon detector for measurement/detection. Similarly, to measure qubit 205B, the microwave signal 152' at frequency X causes the readout resonator 210B to readout the state information of qubit 205B, and this microwave signal 152' (at frequency X) containing qubit state information can be sent to a photon detector for measurement/detection (or to a heterodyne measurement setup).

The microwave signals 151' and 152' can be respectively transmitted from the qubit-resonator systems 220A and 220B in transmission or reflection. Although not shown for simplicity, a 4-port circulator (or two 3-port circulators coupled together through one port) or switch can be placed between the qubit-resonator system 220A and the JPC 100, and a 4-port circulator (or two 3-port circulators coupled together through one port) or switch can be placed between the qubit-resonator system 220B and the JPC 100. In the case of the 4-port circulator/switch, the 4-port circulator can receive the microwave signal 151 and direct it to the JPC 100. Then, the 4-port circulator/switch can receive and direct the entangled microwave signal 151' to the qubit-resonator system 220A. Finally, the 4-port circulator/switch can receive the microwave signal 151' containing qubit state information from the qubit-resonator system 220A and then direct the microwave signal 151' containing qubit state information to the photon detector (for measurement) or to a heterodyne measurement setup. The same description applies by analogy to the microwave signals 152, 152 and qubit-resonator system 220B.

FIG. 3 is a flowchart 300 of a method of configuring a quantum-limited microwave amplifier (e.g., the JPC 100) according to one or more embodiments. At block 305, a JRM 110 is provided, and at block 310, a first lumped-element resonator 161 (idler resonator) is connected to the JRM 110 in which the first lumped-element resonator 161 includes one or more first lumped elements (e.g., capacitors 10A and 10B).

At block 315, a second lumped-element resonator 162 (signal resonator) is connected to the JRM 110 in which the second lumped-element resonator 162 includes one or more second lumped elements (e.g., capacitors 10C and 10D). The JRM 110, the first lumped-element resonator 161, and the second-lumped element resonator 162 form a JPC 100. The one or more first lumped elements (10A and 10B) and the one or more second lumped elements (10C and 10D) have a value (e.g., 2C) that is a same, thereby configuring the JPC 100 to be spectrally degenerate.

The JRM 110 is a plurality of JJ 130 connected in a loop. The JPC includes a first port 150A and a second port 150B. The first port 150A is connected to the first lumped-element resonator 161 via first coupling capacitors 20A and 20B. The second port 150B is connected to the second lumped-element resonator 162 via second coupling capacitors 20C and 20D. The first and second coupling capacitors 20A-D have a value $C_c/2$ which plays a role in determining the bandwidth for the signal and idler resonators 162 and 161.

The first port 150A of the JPC 100 is configured to receive a first microwave signal 151 at a first frequency (e.g., $f_I$=10 GHz) via a difference port Δ of a first hybrid coupler 120A and the second port 150B is configured to receive a second microwave signal 152 at a second frequency (e.g., $f_S$=10 GHz) via another difference port Δ of a second hybrid coupler 120B, where the first and second frequencies are the same frequency (e.g., 10 GHz).

The JPC 100 is configured to amplify the first microwave signal 151 and the second microwave signal 152 having the same frequency, without the first microwave signal 151 leaking out the difference port Δ (signal port) of the second hybrid coupler 120B and without the second microwave signal 152 leaking out the other difference port Δ (idler port) of the first hybrid coupler 120A, because the JPC 100 is configured to be spectrally degenerate. Either the first port 150A or the second port 150B is configured to receive input of a pump microwave signal 153 at a pump frequency $f_P$, in which the pump microwave signal 153 is received via a sum port Σ of either the first hybrid coupler 120A or the second hybrid coupler 120B. The pump frequency is a sum of the first and second frequencies $f_P = f_I + f_S$. The first lumped-element resonator and the second lumped-element resonator are made of superconducting material.

The first and the second coupling capacitors (20A-D) are lumped elements, and the lumped elements are selected from the group consisting of gap capacitors, interdigitated capacitors, and/or plate capacitors.

FIG. 4 is a flowchart 400 of a method for configuring a system 200 for remotely entangling qubits through measurement according to one or more embodiments.

At block 405, a JPC 100 is provided, and at block 410, a first qubit-resonator system 220A is connected to the JPC 100 in which the first qubit-resonator system 220A includes a first qubit 205A coupled to a first readout resonator 210A.

At block 415, a second qubit-resonator system 220B is connected to the JPC 100, in which the second qubit-resonator system 220B includes a second qubit 205B coupled to a second readout resonator 210B. The JPC 100 is configured to remotely entangle the first qubit 205A and the second qubit 205B by reading out both the first and the second corresponding readout resonators 210A and 210B at the frequency X (e.g., 10 GHz).

The JPC 100 is configured to transmit a first readout signal (e.g., microwave signal 151') at the frequency X to the first readout resonator 210A in the first qubit-resonator system 220A and transmit a second readout signal (e.g., microwave signal 152') at the frequency X to the second readout resonator 210B in the second qubit-resonator system 220B. The photons of the first and the second readout signals 151' and 152' are entangled at the frequency X by the JPC 100, thereby entangling the first qubit 205A and the second qubit 205B coupled respectively to the first readout resonator 210A and the second readout resonator 210B whose resonance frequency is X.

The frequency X is a same value (e.g., 10 GHz) for both the first and the second readout signals 151' and 152'. The first and the second readout resonators 210A and 210B are each configured with a resonance frequency equal to the frequency X (e.g., 10 GHz).

Technical benefits include a JPC, and the JPC is configured to generate entangled pairs of photons that propagate on different transmission lines while the entangled pairs of photons have the same frequency. The capability of generating entangled photons which have the same frequency can be advantageous in certain scenarios such as the following. The JPC can be utilized for remotely entangling different qubits coupled to readout resonators where the readout resonators have the same frequency (which simplifies the qubit-resonator design). Generating entangled photons having the same frequency (i.e., at the signal and idler resonator frequency) allows for measuring/detecting two-mode squeezing effects between these entangled photons via wave interference using passive unitary beam-splitters such as hybrids. It is noted that two mode squeezing can play important role in quantum communications, and high fidelity readout of quantum states. Furthermore, if single microwave photon detectors are used in order to detect these photons, the photon detectors can be identical (i.e., no need for the photon detectors to detect different frequencies). In one or more embodiments, the JPC can be utilized to considerably simplify the integration of two or more JPCs together on the same chip for example in order to form a quantum-limited directional amplifier.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A quantum-limited microwave amplifier, the amplifier comprising:
   a Josephson ring modulator (JRM);
   a first lumped-element resonator connected to the JRM, the first lumped-element resonator including one or more first lumped elements; and
   a second lumped-element resonator connected to the JRM, the second lumped-element resonator including one or more second lumped elements;
   wherein the JRM, the first lumped-element resonator, and the second-lumped element resonator form a Josephson parametric converter (JPC);
   wherein the one or more first lumped elements and the one or more second lumped elements have a value that is a same, thereby configuring the JPC to be spectrally degenerate.

2. The amplifier of claim 1, wherein the JRM is a plurality of Josephson junctions connected in a loop.

3. The amplifier of claim 1, further comprising a first port and a second port.

4. The amplifier of claim 3, wherein the first port is connected to the first lumped-element resonator via first coupling capacitors; and
   wherein the second port is connected to the second lumped-element resonator via second coupling capacitors.

5. The amplifier of claim 4, wherein the first and the second coupling capacitors are lumped elements; and
   wherein the lumped elements are selected from the group consisting of gap capacitors, interdigitated capacitors, and plate capacitors.

6. The amplifier of claim 3, wherein the first port is configured to receive a first microwave signal at a first frequency via a difference port of a first hybrid coupler and the second port is configured to receive a second microwave signal at a second frequency via another difference port of a second hybrid coupler, the first and the second frequencies being a same frequency.

7. The amplifier of claim 6, wherein the JPC is configured to amplify the first microwave signal and the second microwave signal having the same frequency, without the first microwave signal leaking out the difference port of the second hybrid coupler and without the second microwave signal leaking out the another difference port of the first hybrid coupler, despite the JPC being configured to be spectrally degenerate.

8. The amplifier of claim 7, wherein either the first port or the second port is configured to receive input of a pump microwave signal at a pump frequency, the pump microwave signal received via a sum port of either the first hybrid coupler or the second hybrid coupler.

9. The amplifier of claim 8, wherein the pump frequency is a sum of the first and the second frequencies.

10. The amplifier of claim 1, wherein the first lumped-element resonator and the second lumped-element resonator are made of superconducting material.

11. A method of configuring a quantum-limited microwave amplifier, the method comprising:
    providing a JRM;
    providing a first lumped-element resonator connected to the JRM, the first lumped-element resonator including one or more first lumped elements; and
    providing a second lumped-element resonator connected to the JRM, the second lumped-element resonator including one or more second lumped elements;
    wherein the JRM, the first lumped-element resonator, and the second-lumped element resonator form a JPC;
    wherein the one or more first lumped elements and the one or more second lumped elements have a value that is a same, thereby configuring the JPC to be spectrally degenerate.

12. The method of claim 11, wherein the JRM is a plurality of Josephson junctions connected in a loop.

13. The method of claim 11, wherein the JPC includes a first port and a second port.

14. The method of claim 13, wherein the first port is connected to the first lumped-element resonator via first coupling capacitors; and
    wherein the second port is connected to the second lumped-element resonator via second coupling capacitors.

15. The method of claim 14, wherein the first and the second coupling capacitors are lumped elements; and
    wherein the lumped elements are selected from the group consisting of gap capacitors, interdigitated capacitors, and plate capacitors.

16. The method of claim 13, wherein the first port is configured to receive a first microwave signal at a first frequency via a difference port of a first hybrid coupler and the second port is configured to receive a second microwave signal at a second frequency via another difference port of a second hybrid coupler, the first and the second frequencies being a same frequency.

17. The method of claim 16, wherein the JPC is configured to amplify the first microwave signal and the second microwave signal having the same frequency, without the first microwave signal leaking out the difference port of the second hybrid coupler and without the second microwave signal leaking out the another difference port of the first hybrid coupler, despite the JPC being configured to be spectrally degenerate.

18. The method of claim 17, wherein either the first port or the second port is configured to receive input of a pump microwave signal at a pump frequency, the pump microwave signal received via a sum port of either the first hybrid coupler or the second hybrid coupler.

19. The method of claim 18, wherein the pump frequency is a sum of the first and the second frequencies.

20. The method of claim 11, wherein the first lumped-element resonator and the second lumped-element resonator are made of superconducting material.

* * * * *